United States Patent [19]

Nakagawa et al.

[11] Patent Number: 4,680,604
[45] Date of Patent: Jul. 14, 1987

[54] CONDUCTIVITY MODULATED MOS TRANSISTOR DEVICE

[75] Inventors: Akio Nakagawa, Hiratsuka; Kiminori Watanabe, Kawasaki, both of Japan

[73] Assignee: Kabushiki Kaisha Toshiba, Kawasaki, Japan

[21] Appl. No.: 930,083

[22] Filed: Nov. 13, 1986

Related U.S. Application Data

[63] Continuation of Ser. No. 707,556, Mar. 4, 1985, abandoned.

[30] Foreign Application Priority Data

Mar. 19, 1984 [JP] Japan ................................ 59-52810

[51] Int. Cl.$^4$ ...................... H01L 29/78; H01L 29/74
[52] U.S. Cl. ................................ 357/23.4; 357/38
[58] Field of Search ........................ 357/23.4, 38, 43

[56] References Cited

U.S. PATENT DOCUMENTS

| | | | |
|---|---|---|---|
| 4,345,265 | 8/1982 | Blanchard | 357/23.4 |
| 4,364,073 | 12/1982 | Becke et al. | 357/23.4 |
| 4,503,598 | 3/1985 | Vora et al. | 357/23.4 |
| 4,587,713 | 5/1986 | Goodman et al. | 357/23.4 |

FOREIGN PATENT DOCUMENTS

| | | | |
|---|---|---|---|
| 0965188 | 3/1975 | Canada | 357/23.4 |
| 0094891 | 11/1983 | European Pat. Off. | 357/23.4 |
| 2904424 | 8/1980 | Fed. Rep. of Germany | 357/23.4 |
| 57-42164 | 3/1982 | Japan | 357/23.4 |
| 58-16569 | 1/1983 | Japan | 357/23.4 |
| 58-68979 | 4/1983 | Japan | 357/23.4 |
| 58-153368 | 9/1983 | Japan | 357/23.4 |
| 5819771 | 11/1983 | Japan | 357/23.4 |
| 2062349 | 5/1981 | United Kingdom | 357/23.4 |
| 2103877 | 2/1983 | United Kingdom | 357/23.4 |

Primary Examiner—Martin H. Edlow
Assistant Examiner—John Lamont
Attorney, Agent, or Firm—Oblon, Fisher, Spivak, McClelland, & Maier

[57] ABSTRACT

There is a conductivity modulated MOS transistor comprising: a p-type region formed in the surface area of an n$^-$-type layer formed on a p$^+$-type layer; an n$^+$-type region formed in the surface area of this p-type region to face the n$^-$-type layer; and a gate electrode formed through a gate insulation layer over a surface region of the p-type region sandwiched between the n$^-$-type layer and the n$^+$-type region. This MOS transistor further comprises a p$^+$-type region formed inside the p-type region, at least under the n$^+$-type region and having a higher impurity concentration than the p-type region.

5 Claims, 10 Drawing Figures

CONDUCTIVITY MODULATED MOS TRANSISTOR DEVICE

This application is a continuation, of application Ser. No. 707,556, filed Mar. 4, 1985 now abandoned.

BACKGROUND OF THE INVENTION

The present invention relates to a conductivity modulated MOS transistor device which is used as a power switching device.

Recently, a power MOSFET having source and channel regions which are formed by a Diffusion Self Align (DSA) method has been on the market as a power switching element. However, an element having a blocking voltage over 1000 V and sufficiently low ON-state resistance has not been realized yet. This is because if the blocking voltage is raised in an ordinary power MOSFET, the ON-state resistance will have been increased. To solve this problem, the use of a conductivity modulated (COM) FET, as the power MOSFET, is needed. As shown in FIG. 1, this COMFET comprises a p+-type silicon substrate 1 serving as a drain region, a high resistance layer 2 of an n−-type formed on the silicon substrate 1, p-type base regions 3-1 and 3-2 and n+-type source regions 4-1 to 4-3 which are formed on the surface of the n−-type layer 2 by a DSA method. The surface areas of the p-type regions 3-1 and 3-2 between the n−-type layer 2 and the n+-type regions 4-1 to 4-3 act as channel regions 5-1 to 5-3. Further, a gate electrode 7-1 is formed through an insulation layer 6-1 over the n+-type region 4-1, channel region 5-1 and a part of the n−-type region 2. A gate electrode 7-2 is formed through an insulation layer 6-2 over the surface areas of the channel regions 5-2 and 5-3 and n−-type layer 2 between the n+-type regions 4-2 and 4-3. On the other hand, a source electrode 8-1 is formed on the n+-type regions 4-1 and 4-2 and p-type region 3-1. A source electrode 8-2 is formed on the n+-type region 4-3 and p-type region 3-2. A drain electrode 9 is formed on the p+-type substrate 1.

For example, in case of forming the p-type region 3-1 and n+-type regions 4-1 and 4-2 by the DSA method, the portion defining the outermost side in the mask used to form the p-type region 3-1 is also used as it is in order to form the n+-type regions 4-1 and 4-2. This makes it possible to set a distance between the outermost side of the p-type region 3-1 and the outermost side of the n+-type region 4-1 or 4-2, namely, a length of the channel region 5-1 or 5-2, to a desired value in accordance with diffusion process parameters such as diffusion time, diffusion temperature and the like.

When this COMFET is turned on, for instance, electrons flow from the n+-type regions 4-1 and 4-2 into the n−-type layer 2 through the channel regions 5-1 and 5-2, respectively, and at the same time holes are injected from the p+-type substrate 1 into the n−-type layer 2. Thus, a great amount of carriers are stored in the n−-type layer 2, thereby allowing the conductivity in the n−-type layer 2 to be modulated. The holes injected into the n−-type layer 2 flow into the source electrode 8-1, for instance, through the areas in the p-type region 3-1 below the n+-type regions 4-1 and 4-2.

Although the COMFET shown in FIG. 1 has a structure similar to a thyristor, the source electrode 8-1 electrically connects the p-type region 3-1 with the n+-type regions 4-1 and 4-2, so that this COMFET does not ordinarily operate as a thyristor.

This COMFET can be constituted so as to have sufficiently high blocking voltage and sufficiently small ON-state resistance owing to the conductivity modulation effect.

However, in this COMFET, when a large current flows into the COMFET when it is conductive, the voltage drop in the transverse direction at the p-base resistance area below the n+-type regions 4-1 and 4-2 increases. The voltage drop acts to forwardly bias the pn junction between the p-type region 3-1 and the n+-type region 4-1 or 4-2, so that this COMFET will have operated similarly to a thyristor. Thus, even if the voltages between the gate electrodes 7-1, 7-2 and the source electrode 8-1 are set to 0 V, a latch-up phenomenon is caused, so that the COMFET is not turned off.

To solve this problem, as shown in FIG. 2, conventionally, p+-type regions 10-1 and 10-2 are formed by diffusing p+-type impurities into the areas below the n+-type regions 4-1 and 4-2 and n+-type region 4-3. The resistance in the transverse direction in the area below the n+-type regions 4-1 and 4-2 is reduced due to the existence of the p+-type region 10-1. However, in this case, it is required to hold the impurity concentration in the channel regions 5-1 and 5-2 to be a low value; therefore, the diffusion in the transverse direction of the p+-type region 10-1 must not reach the channel regions. Further, since the depth of diffusion of the p+-type region 10-1 is great, a length of portion A of the transverse diffusion is long and the sheet resistance in the portion A cannot be made small enough as compared with that in a portion B, so that the resistance in the area from the channel region 5-1 to the source electrode 8-1 cannot be made sufficiently small. Consequently, the latch-up of the parasitic thyristor which is constituted by the regions 4-1, 3-1, 2 and 1 cannot be suppressed.

SUMMARY OF THE INVENTION

It is an object of the present invention to provide a conductivity modulated MOS transistor device in which even in the case where a large current is allowed to flow, the latch-up phenomenon can be effectively suppressed.

This object is accomplished by a conductivity modulated MOS transistor device comprising: a semiconductor substrate of one conductivity type; a semiconductor layer of an opposite conductivity type formed on this substrate; a first semiconductor region of the one conductivity type formed in the surface area of this semiconductor layer; a second semiconductor region of the opposite conductivity type formed in the surface area of the first semiconductor region to face the semiconductor layer; the surface region of the first semiconductor region sandwiched between the second semiconductor region and the semiconductor layer forming a channel region; a gate region including a gate insulation layer formed at least on this channel region and a gate electrode formed on this gate insulation layer; and a third semiconductor region of the one conductivity type formed in the first semiconductor region, at least under the second semiconductor region and having a higher impurity concentration than the first semiconductor region.

DETAILED DESCRIPTION OF THE PREFERRED EMBODIMENTS

Figure 3:
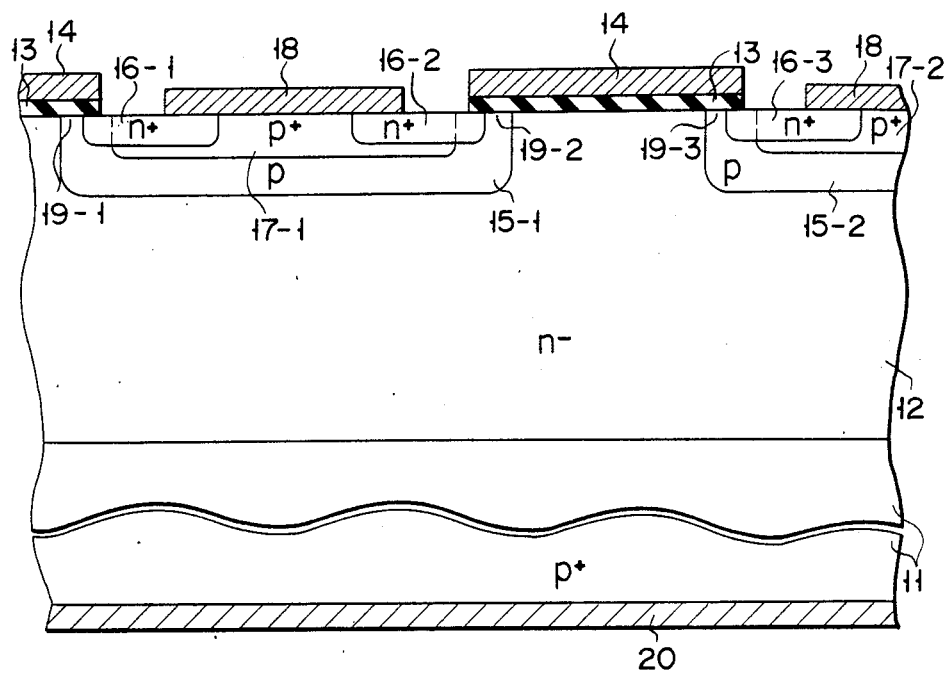
FIG. 3 is a schematic cross sectional view of a COMFET according to one embodiment of the present invention.

FIG. 3 schematically shows a cross section of a conductivity modulated MOS transistor according to one embodiment of the present invention. In the case of manufacturing this COMMOS transistor, an $n^-$-type layer 12, having a low impurity concentration, a specific resistance over 50 Ω-cm and a thickness of about 100 μm, is first formed on a prepared $p^+$-type silicon substrate 11 due to an epitaxial growth method. Next, the surface of the $n^-$-type layer 12 is oxidized to form a gate oxide film 13 and a polysilicon gate electrode 14 having a thickness of about 0.5 μm is formed on the gate oxide film 13. Thereafter, the gate electrode 14 is selectively removed by an etching process. Then, boron is diffused into the $n^-$-type layer 12 using the residual gate electrode 14 as a mask to have a depth of about 8 μm, thereby forming p-type base regions 15-1 and 15-2. Subsequently, only the central portion of the window defined by the gate electrode 14 is covered by oxide films (not shown) and arsenic (As) is implanted into the p-type regions 15-1 and 15-2 with a dose amount of $5 \times 10^{15}$ cm$^{-2}$ by an ion implantation using these oxide films and gate electrode 14 as masks. The oxide films used for masking are removed to form a resist pattern having a window smaller than the window defined by the gate electrode 14. Boron is then implanted into the p-type regions 15-1 and 15-2 with a dose amount of $1 \times 10^{15}$ cm$^{-2}$ by an ion implantation using this resist pattern as a mask. The semiconductor structure obtained in this way is subjected to thermal treatment and the ion-implanted boron regions and arsenic regions are subjected to an annealing process, thereby forming $n^+$-type regions 16-1, 16-2 and 16-3 and $p^+$-type regions 17-1 and 17-2. Since the diffusing speed of boron is faster than arsenic, the $p^+$-type regions 17-1 and 17-2 are formed more deeply than the $n^+$-type regions 16-1 to 16-3. An oxide film (not shown) is formed on the whole upper surface of the semiconductor structure by a chemical vapor deposition method and contact holes are formed in this oxide film. After an Al layer is formed by a vapor deposition method, this Al layer is selectively removed to form a source electrode 18. Finally, a drain electrode 20 of a V-Ni-Au film is formed on the back surface of the substrate 11.

On the other hand, in the above manufacturing processes, it is also possible to execute an ion implantation to form the $p^+$-type regions 17-1 and 17-2 and after the annealing process, an ion implantation to form the $n^+$-type regions 16-1 to 16-3 may be performed.

In this embodiment, the p-type regions 15-1 and 15-2 are formed with impurity concentration of about $7 \times 10^{16}$ cm$^{-3}$, to set a threshold value of this COMFET to 1 to 3 V, while the $p^+$-type regions 17-1 and 17-2 are formed inside the p-type regions 15-1 and 15-2 more deeply than the $n^+$-type regions 16-1 to 16-3. Thicknesses of $n^+$-type regions 16-1 to 16-3 are set to be less than 0.3 μm, for example, 0.1 to 0.25 μm. The impurity concentration of the $p^+$-type region 17-1 under the $n^+$-type regions 16-1 and 16-2 and the $p^+$-type region 17-1 can be set to a value which is ten or more times larger than $7 \times 10^{16}$ cm$^{-3}$, which is an impurity concentration of the p-type region 15-1, for example, to a value of $5 \times 10^{18}$ cm$^{-3}$. The $p^+$-type region 17-1 can be set to a high impurity concentration even in the region near the channel regions, since the diffusion in the transverse direction is less. Therefore, a resistance between a channel region 19-1, 19-2 or 19-3 and the source electrode 18 can be made very small, thereby making it possible to set a current upon latch-up to a large value. Since the $n^+$-type regions 16-1 to 16-3 are formed as thin as about 0.2 μm, injection efficiency of the carriers from the $n^+$-type regions 16-1 to 16-3 into the p-type regions 15-1 to 15-2 is made remarkably low, thereby making it difficult for this COMFET to operate as a thyristor. As described above, in this embodiment, it is possible to obtain a COMFET, having a high withstanding voltage over 1000 V and a small enough ON-state resistance (e.g., 0.02 Ω in the FET of 1 cm$^2$), which does not operate as a thyristor even if it carries an operating current of up to 1000 A/cm$^2$.

Figure 1:
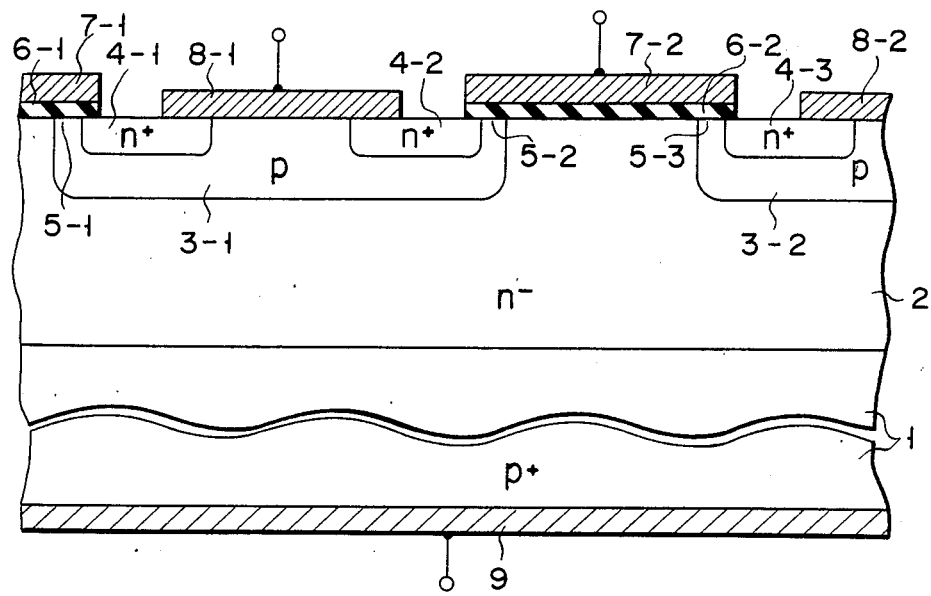
FIG. 1 is a schematic cross sectional view of a conventional COMFET.
Figure 2:
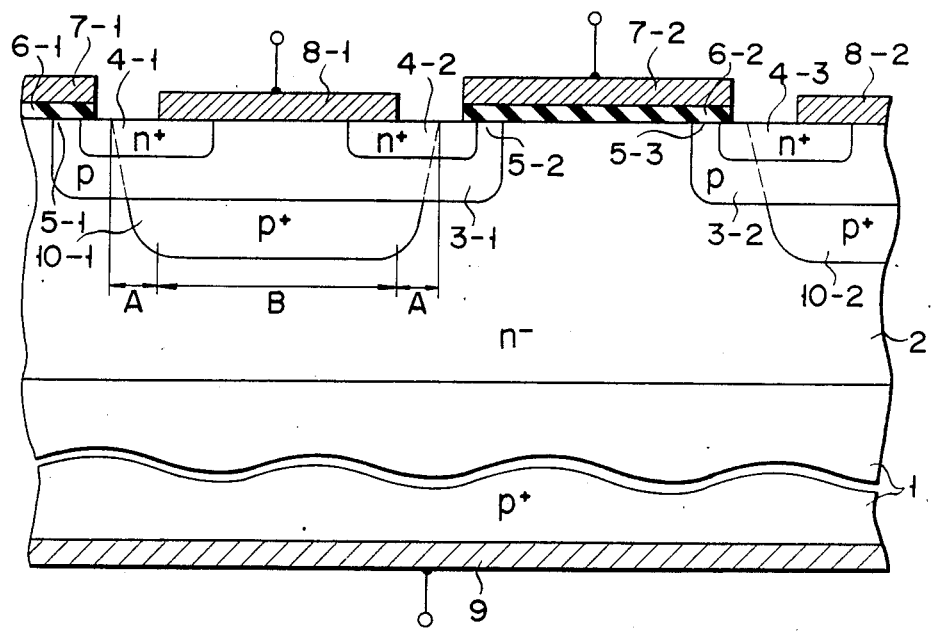
FIG. 2 is a schematic cross sectional view of a COMFET in which the latch-up current characteristic of the COMFET shown in FIG. 1 is improved.
Figure 4:
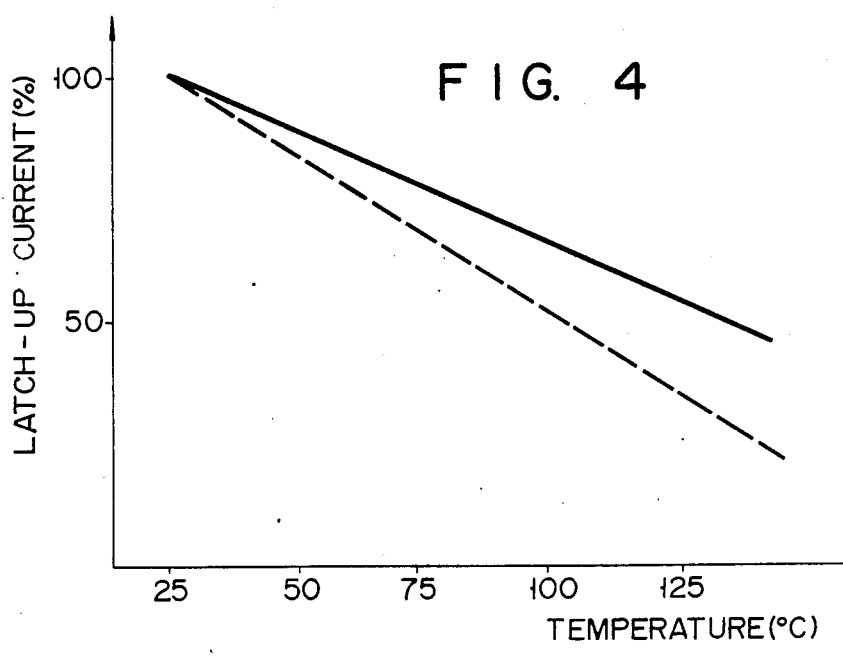
FIG. 4 is a graph showing the latch-up current characteristics of the COMFETs shown in FIGS. 2 and 3.

FIG. 4 shows the relationship between the latch-up current and the temperature of the COMFETs of FIGS. 2 and 3 by a broken line and a solid line, respectively. In the cases where the p-type region 3-1 and $p^+$-type region 10-1 in FIG. 2 were formed to have depths of 4 μm and 7 μm respectively and where the p-type region 15-1 and $p^+$-type region 17-1 in FIG. 3 were formed to have depths of 4 μm and 2 μm, respectively. In this case, the latch-up currents of the COMFETs of FIGS. 2 and 3 are 500 A/cm$^2$ and 1000 A/cm$^2$ at 25° C., respectively. The latch-up current in the COMFET shown in FIG. 3 is larger. In FIG. 4, the latch-up current at a temperature of 25° C. is set at 100. It is obvious from FIG. 4 that with an increase in temperature the latch-up current in the COMFET of FIG. 2 decreases at a greater rate than that of the COMFET of FIG. 3. It is considered that this is because in the COMFET shown in FIG. 2, the $p^+$-type region 10-1 is deeply formed, so that the impurity concentration of the portion formed due to the transverse diffusion in the $p^+$-type region 10-1 is lower than the central portion thereof. Namely, the resistance of the outer peripheral region of the $p^+$-type region 10-1 which has a small impurity concentration and is located below the $n^+$-type region 4-1, largely varies in dependence upon a change in temperature, so this causes the latch-up current to vary considerably. On the contrary, since the p+-type region 17-1 in FIG. 3 is shallow, the portion which is formed due to the diffusion in the transverse direction hardly exists and the p+-type region 17-1 has an uniformly high impurity concentration over the whole area. Therefore, the local region of the p+-type region 17-1 located below the n+-type region 16-1 also has a high impurity concentration, thus resistance in this local region is low and does not vary very much with a change in temperature. Consequently, the latch-up current of this COMFET does not largely vary in dependence upon the change in temperature.

Figure 5:
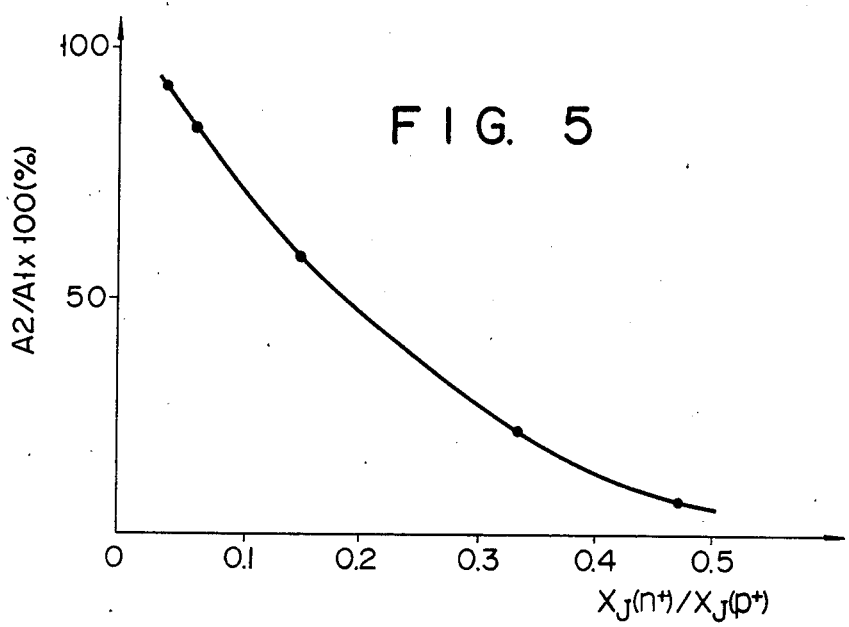
FIG. 5 is a graph showing the relationship between the ratio of the depths of $n^+$-type and $p^+$-type regions in FIG. 3 and the quantity of uncompensated boron in this $p^+$-type region.

FIG. 5 shows the relationship between the ratio $X_J(n^+)/X_J(p^+)$ of a depth $X_J(n^+)$ of the n+-type region 16-1 and a depth $X_J(p^+)$ of the p+-type region 17-1 in FIG. 3; and the ratio A2/A1 of an amount A2 ($cm^{-2}$) of uncompensated boron in the outer peripheral region of the p+-type region 17-1 existing below the n+-type region 16-1 which is not affected by the formation of the n+-type region 16-1 and a total dose amount A1 ($cm^{-2}$) of implanted boron.

It is obvious from FIG. 5 that in a case where the depth $X_J(n^+)$ of n+-type region 16-1 is set to a value of 20% or more of the depth $X_J(p^+)$ of p+-type region 17-1, the ratio of the amount A2 of uncompensated boron to the total boron dose A1 will become less than 50%. It is desirable to set the $XJ(n^+)$ to be less than 20% of the $X_J(p^+)$. To set the distance of diffusion in the transverse direction to a small enough value, e.g., less than 2 μm, it is required to suppress the diffusion depth of p+-type region 17-1 to be less than 2 μm. On the other hand, in the region below the n+-type region 16-1, in order to leave at least 50% of the total boron dose A1 in the p+-type region 17-1, it is necessary to set the diffusion depth of n+-type region 16-1 to be less than 0.34 μm, as will be understood from FIG. 5.

Figure 6:
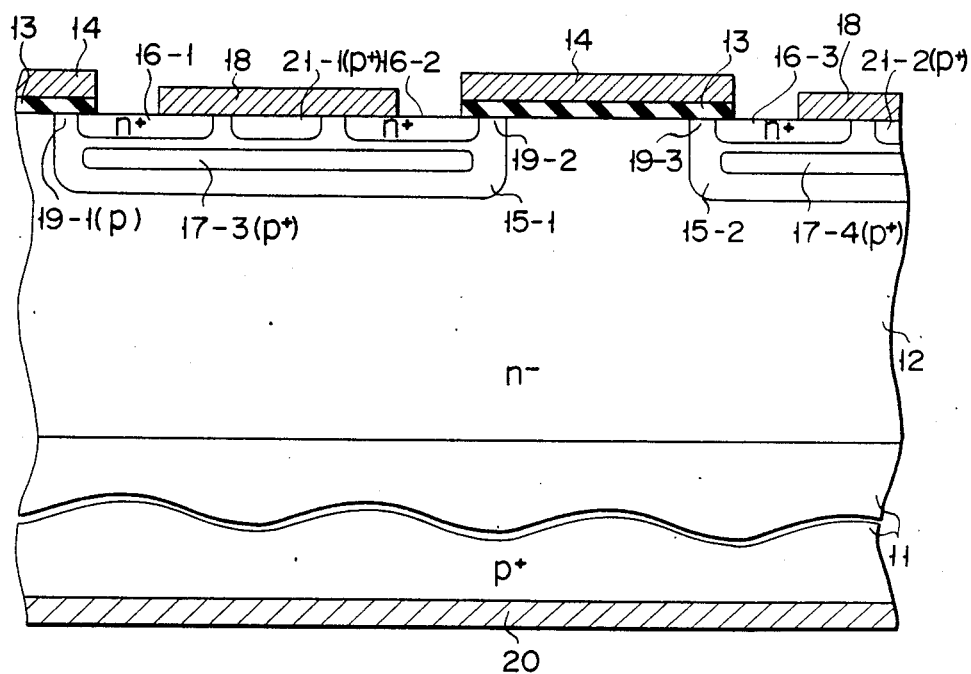
FIG. 6 is a schematic cross sectional view of a COMFET according to another embodiment of the present invention.

FIG. 6 shows a schematic structure of a COMFET according to another embodiment of the present invention. This COMFET is constituted in a similar manner to that shown in FIG. 3, except that p+-type regions 21-1 and 21-2 are respectively formed in the surface areas of the p-type regions 15-1 and 15-2 and that, in place of the p+-type regions 17-1 and 17-2, a p+-type embedded layer 17-3 is formed below the n+-type regions 16-1 and 16-2 and a p+-type embedded layer 17-4 is formed below the n+-type region 16-3.

These p+-type embedded layers 17-3 and 17-4 are formed after the n+-type regions 16-1, 16-2 and 16-3 were formed in the surface areas of the p-type regions 15-1 and 15-2 to have depths of about 0.2 μm, p+-type impurities are implanted at an accelerating voltage of about 200 keV into the portions located below the n+-type regions 16-1 and 16-2 and source electrode 18, and into the portions locating below the n+-type region 16-3 and source electrode 18 by the ion implantation. They are then subjected to the annealing process.

In this embodiment, the portions in the p+-type layers 17-3 and 17-4, below the p+-type regions 21-1 and 21-2, can be removed.

In this embodiment, the resistance between the channel region 19-1, 19-2 or 19-3 and the source electrode 18 can be made small enough similar to that shown in FIG. 3, and a high withstanding voltage, a large latch-up current and a small ON-state resistance can be derived.

Figure 7:
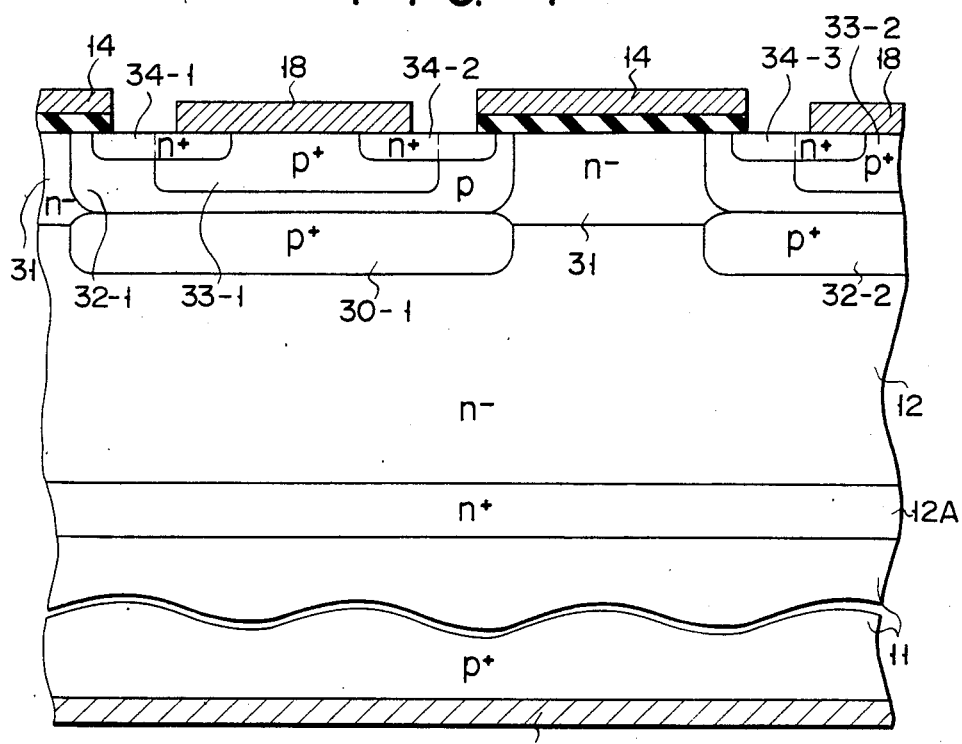
FIG. 7 is a schematic cross sectional view of a COMFET according to still another embodiment of the invention.

FIG. 7 shows a schematic cross sectional structure of the COMFET according to still another embodiment of the present invention. In this embodiment, an n+-type layer 12A is formed on the p+-type substrate 11 and the n−-type layer 12 is formed on the n+-type layer 12A.

The p+-type regions 30-1 and 30-2 are formed in the surface areas of the n−-type layer 12 and an n−-type layer 31 is formed on the n−-type layer 12 and p+-type regions 30-1 and 30-2 by an epitaxial growth method. Further, in the n−-type epitaxial layer 31, p-type layers 32-1 and 32-2 are formed so as to reach the p+-type regions 30-1 and 30-2. Thereafter, p+-type regions 33-1 and 33-2 are respectively formed in the p-type regions 32-1 and 32-2 and n+-type regions 34-1, 34-2 and 34-3 are formed in the surface areas of the p-type regions 32-1 and 32-2.

In this embodiment, the resistances under the n+-type regions 34-1, 34-2 and 34-3 can also be remarkably reduced due to the existence of the p+-type regions 30-1 and 30-2. Consequently, even if the operating current increases, the latch-up phenomenon is unlikely to occur in this COMFET.

Figure 8:
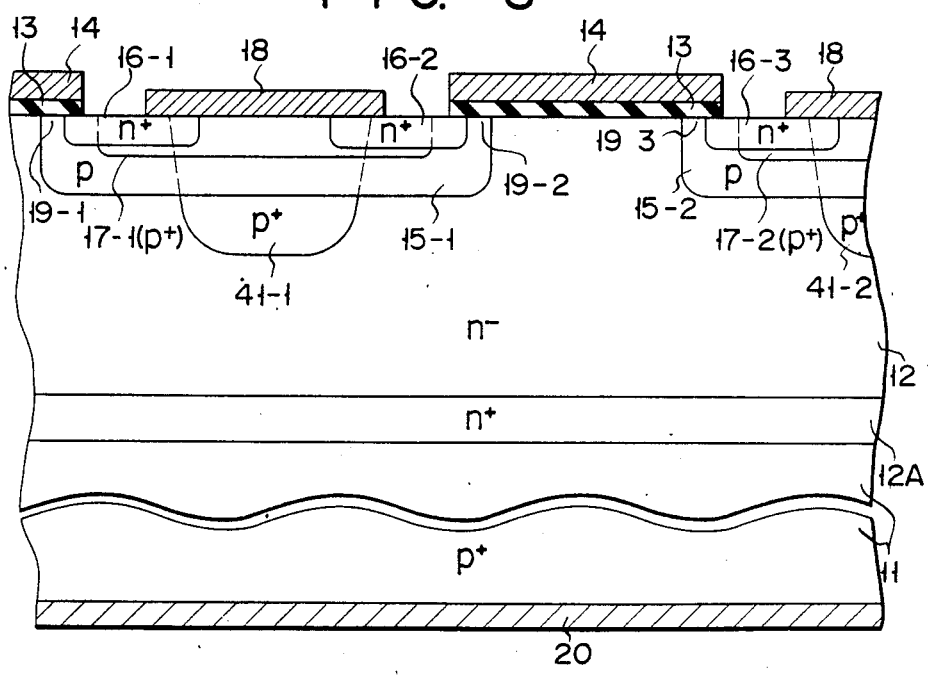
FIG. 8 shows a modified form of the COMFET shown in FIG. 3 in which the withstanding voltage of the COMFET shown in FIG. 3 is improved.
Figure 9:
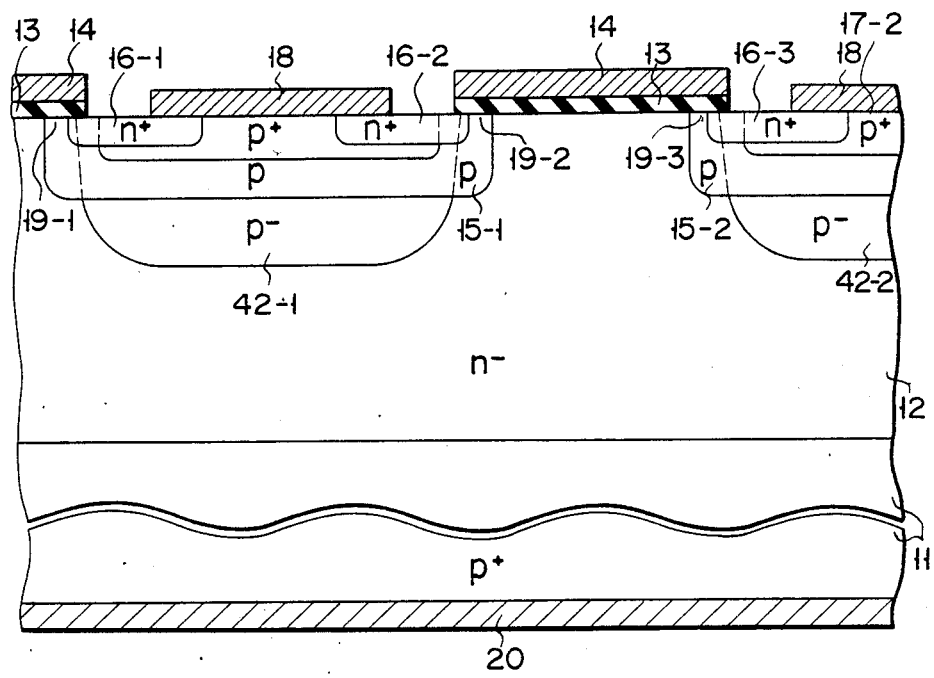
FIG. 9 shows another modified form of the COMFET shown in FIG. 3 in which the withstanding voltage of the COMFET shown in FIG. 3 is improved.
Figure 10:
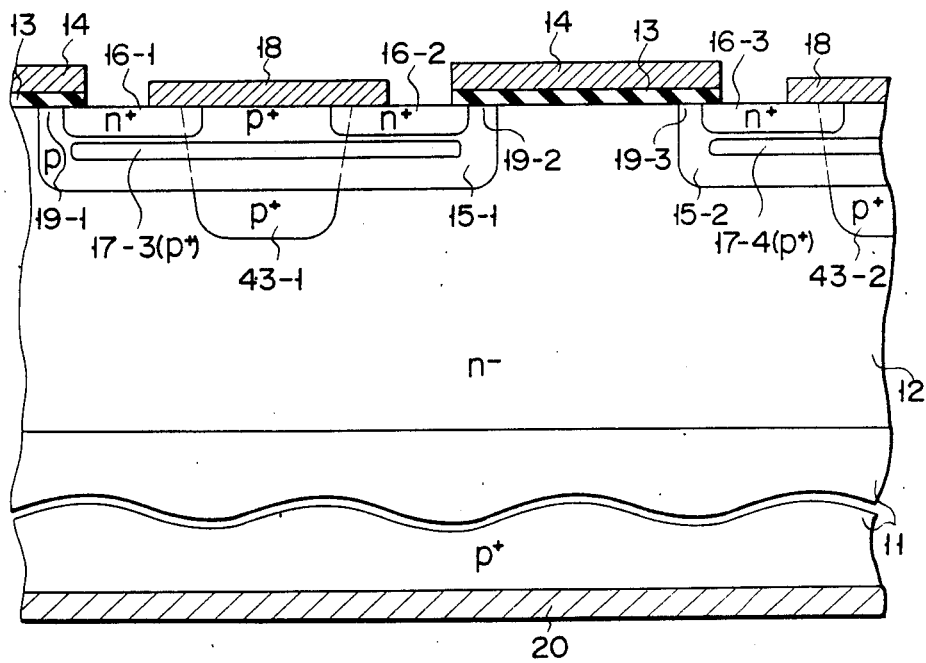
FIG. 10 shows a modified form of the COMFET shown in FIG. 6 in which the withstanding voltage of the COMFET shown in FIG. 6 is improved.

FIG. 8 is a modified form of the COMFET shown in FIG. 3. This modification is constituted substantially in a similar manner to that shown in FIG. 3 except that it also comprises p+-type regions 41-1 and 41-2 and the n+-type layer 12A. The p+-type regions 41-1 and 41-2 are formed from the central portions of the surface areas of the p+-type regions 17-1 and 17-2 by the diffusion and are formed deeper than the p-type regions 15-1 and 15-2. By forming the deep p+-type regions 41-1 and 41-2 below the source electrodes 18 in this way, the latch-up current of this COMFET can be further increased.

Although the present invention has been described with respect to the embodiments, the invention is not limited to only these embodiments. For example, in the embodiments shown in FIGS. 6 and 7, the p+-type regions 21-1 and 33-1 may be formed so as to come into contact with the p+-type regions 17-3 and 30-1, respectively.

On the other hand, in all of the foregoing embodiments, the p+-type layer 11 is used as the fundamental semiconductor body. However, it is also possible to form the n+-type layer 12A and p+-type layer 11 on and over the n−-type layer 12 by diffusion and use this n−-type layer 12 as the fundamental semiconductor body.

What is claimed is:

1. A conductivity modulated MOS transistor device comprising:
 a first semiconductor layer of one conductivity type;
 a second semiconductor layer of an opposite conductivity type, formed in contact with said first semiconductor layer;
 a first semiconductor region of said one conductivity type formed by diffusion in a surface area of said second semiconductor layer;
 a second semiconductor region of said opposite conductivity type formed by diffusion in a surface region of said first semiconductor region to face said second semiconductor layer, the surface region of said first semiconductor region sandwiched between said second semiconductor region and said second semiconductor layer forming a channel region, and a source electrode formed on the second semiconductor region;
 a gate region including a gate insulation layer formed at least on said channel region, and a gate electrode formed on the gate insulation layer;
 a third semiconductor region of said one conductivity type formed by diffusion in said first semiconductor region without entering the channel region, and shallower than said first semiconductor region and deeper than said second semiconductor region, and including a portion which lies outside a vertical projection of said source electrode directly under said second semiconductor region and has a higher impurity concentration than said first semiconductor region; and a fourth semiconductor region of said one conductivity type formed by diffusion from central portions of the surface of said third semiconductor region within the vertical projection of said third semiconductor region and deeper than the first semiconductor region without extending to said portion of said third semiconductor region and said channel region.

2. A conductivity-modulated MOS transistor according to claim 1, wherein said fourth semiconductor region is formed outside the vertical projection of said gate electrode.

3. A conductivity-modulated MOS transistor according to claim 1, wherein said fourth semiconductor region is formed inside the vertical projection of said source electrode.

4. A MOS transistor device according to claim 1, wherein said third semiconductor region is formed at at depth which is at least twice as deep as said second semiconductor region.

5. A MOS transistor device according to claim 4, wherein said second semiconductor region is formed at a depth of not more than 0.3 $\mu$m.

* * * * *